United States Patent
Yao et al.

(10) Patent No.: US 12,340,152 B1
(45) Date of Patent: Jun. 24, 2025

(54) LARGE-SCALE UNDERGROUND SHIELD DOCKING MODEL TEST PLATFORM AND TEST METHOD USING SAME

(71) Applicant: CCCC TUNNEL ENGINEERING CO., LTD., Nanjing (CN)

(72) Inventors: Zhanhu Yao, Nanjing (CN); Yazhou Zhang, Nanjing (CN); Ping Lu, Nanjing (CN); Yisheng Wang, Nanjing (CN); Hui Li, Nanjing (CN); Lei Zhang, Nanjing (CN); Chi Wei, Nanjing (CN); Xiao Yan, Nanjing (CN); Yuqiang Liang, Nanjing (CN); Yahui Li, Nanjing (CN); Chao Zhang, Nanjing (CN)

(73) Assignee: CCCC TUNNEL ENGINEERING CO., LTD., Nanjing (CN)

( * ) Notice: Subject to any disclaimer, the term of this patent is extended or adjusted under 35 U.S.C. 154(b) by 0 days.

(21) Appl. No.: 18/868,793

(22) PCT Filed: Sep. 30, 2024

(86) PCT No.: PCT/CN2024/122648
§ 371 (c)(1),
(2) Date: Nov. 25, 2024

(30) Foreign Application Priority Data

Dec. 18, 2023 (CN) .......................... 202311740389.9

(51) Int. Cl.
*G06F 30/13* (2020.01)
*G01V 20/00* (2024.01)
*E21D 9/00* (2006.01)

(52) U.S. Cl.
CPC .............. *G06F 30/13* (2020.01); *G01V 20/00* (2024.01); *E21D 9/003* (2013.01)

(58) Field of Classification Search
CPC ......... G06F 30/00; G06F 30/13; G01V 20/00; E21D 9/003
(Continued)

(56) References Cited

FOREIGN PATENT DOCUMENTS

| CN | 1619280 A | 5/2005 |
|---|---|---|
| CN | 103235110 A | 8/2013 |

(Continued)

OTHER PUBLICATIONS

Ding, W.Q. et al., "Analysis of Shield Tunnel", 2004, International Journal for Numerical and Analytical Methods in Geomechanics, Int. J. Numer. Anal. Meth. Geomech, 28, John Wiley & Sons, Ltd. (Year: 2004).*

(Continued)

*Primary Examiner* — Cedric Johnson
(74) *Attorney, Agent, or Firm* — Cooper Legal Group, LLC

(57) ABSTRACT

A large-scale underground shield docking model test platform and a test method using the same are provided. The test platform includes a test soil tank, a partition wall, a shield docking model, and a freezing system. The test soil tank is of an underground foundation pit structure, the partition wall is disposed in the test soil tank to separate the test soil tank into a filling area and a non-filling area. The shield docking model is disposed in the filling area and is a reduced-scale test model. The shield docking model is provided with the freezing system, including a refrigeration system, a coolant circulation system, and freezing pipes. The freezing pipes are arranged on the shield docking model and are connected to the refrigeration system through the coolant circulation system. The refrigeration system is placed on a laminate in the non-filling area of the test soil tank.

4 Claims, 5 Drawing Sheets

(58) Field of Classification Search
USPC .............................................................. 703/1
See application file for complete search history.

(56) References Cited

FOREIGN PATENT DOCUMENTS

| | | | | |
|---|---|---|---|---|
| CN | 207730761 U | | 8/2018 | |
| CN | 113310849 A | | 8/2021 | |
| CN | 114910282 A | * | 8/2022 | ........... G01V 99/005 |
| CN | 117825082 A | | 4/2024 | |
| JP | 2016160717 A | | 9/2016 | |

OTHER PUBLICATIONS

Funasaki, T. et al., "Underground Shield Docking for the Trans-Tokyo Bay Highway", May 24-28, 1998, Proceedings of the Eight International Offshore and Polar Engineering Conference, The International Society of Offshore and Polar Engineers. (Year: 1998).*

\* cited by examiner

LARGE-SCALE UNDERGROUND SHIELD DOCKING MODEL TEST PLATFORM AND TEST METHOD USING SAME

CROSS REFERENCE TO THE RELATED APPLICATIONS

This application is the national phase entry of International Application No. PCT/CN2024/122648, filed on Sep. 30, 2024, which is based upon and claims priority to Chinese Patent Application No. 202311740389.9, filed on Dec. 18, 2023, the entire contents of which are incorporated herein by reference.

TECHNICAL FIELD

The present disclosure relates to the technical field of shield tunneling, and in particular, to a large-scale underground shield docking model test platform and a test method using the same.

BACKGROUND

With the development of social economy, the length of shield tunnels built in China is also increasing. However, long-distance shield excavation may cause problems, such as cutterhead and cutter wear, shield tail seal failure, main bearing seal failure, and slurry pipeline wear and breakage, which seriously affect the progress and safety of shield tunneling. The underground shield docking technology can effectively reduce the length of a single excavation of the shield machine, improve the safety of shield construction, and greatly shorten the construction period. This technology is particularly suitable for working conditions where a shield machine is required to cross rivers, lakes, or seas but it is difficult to excavate shaft wells.

The underground shield docking requires sufficient soil reinforcement at the docking section to maintain the stability of the surrounding strata, and freezing is mainly employed for reinforcement in water-rich soft strata. At present, there are few cases of underground shield docking in and out of China, the construction technology is immature, and it is necessary to carry out systematic and in-depth research on the problems about underground shield docking. Especially in the shield docking process, the impact of frost heave load on the stability of the shield structure during freezing reinforcement, the deformation of the shield and the segment lining along the longitudinal direction of the tunnel caused by frost heave and thaw settlement, the opening and misalignment of segment joints, and so on have not yet been explored. Compared with theoretical research and numerical simulation, the research results obtained through physical model tests are more authentic and reliable, among which the results of prototype tests or large-scale tests are more instructive.

Currently, there are few model tests on underground shield docking. Shi Rongjian et al. (2016) conducted a freezing reinforcement model test for underground shield docking in soft soil strata using a shield docking freezing reinforcement project in Shanghai as a prototype, and studied the distribution characteristics of the freezing temperature field and the frost heave effect of the strata. However, the boundary conditions in the model test are quite different from those in the actual project, the development pattern of the frozen wall makes it difficult to simulate the actual working conditions, and the deformation along the cross section and longitudinal section of the shield tunnel caused by frost heave and thaw settlement can hardly be studied in the test. Patent No. CN103235110A discloses a freezing reinforcement simulation test method suitable for underground shield docking; however, it still has the following deficiencies: (1) This method requires a model tunnel to be buried in a test chamber, and a freezing system needs to be pre-installed before the tunnel is buried in soil. Personnel can no longer enter the tunnel after it is buried in soil, so they cannot debug and operate the freezing system or carry out pre-grouting reinforcement before freezing to study the coupling effect of grouting and freezing reinforcement. Therefore, it is impossible to make feasible suggestions for the optimization, comparison, and selection of strata reinforcement schemes about underground shield docking. (2) In this method, the lateral and vertical boundary conditions of the model tunnel are quite different from the actual situation, making it difficult to effectively simulate the stress and deformation along the cross section of the model tunnel caused by frost heave and thaw settlement. As a result, it is difficult to accurately determine whether the stress safety and deformation of the shield structure exceed limit during docking. (3) In this method, the segment lining behind the shield tail is not considered. It is impossible to explore the relative displacement between the shield and the segment lining caused by frost heave and thaw settlement, or explore the longitudinal deformation of the segment lining and the opening and misalignment of the segment joints. Therefore, it is impossible to accurately evaluate the waterproof safety of the shield tunnel segment lining joints during docking.

SUMMARY

To solve the above problems in the prior art and eliminate the deficiencies of the prior art, the present disclosure provides a large-scale underground shield docking model test platform. The test platform allows personnel to enter the shield docking model to debug and operate various test systems, so as to effectively simulate grouting reinforcement, freezing reinforcement, freeze-thawing, and other processes in underground shield docking. Through the test platform and the test method, the grouting and freezing reinforcement tests for underground shield docking can be carried out to accurately explore issues such as the deformation characteristics of the shield and the segment lining along the cross section and the longitudinal direction of the tunnel, the opening and misalignment of the segment joints, the stress and stability characteristics of the shield, the coupling effect of grouting and freezing reinforcement, and the grout spreading situation. A reliable solution is provided for the research of the shield docking technology and feasible suggestions are put forward for the optimization, comparison, and selection of strata reinforcement schemes.

A large-scale underground shield docking model test platform includes a test soil tank, a partition wall, a shield docking model, and a freezing system.

The test soil tank is of an underground foundation pit structure, the partition wall is disposed in the test soil tank to separate the test soil tank into a filling area and a non-filling area, and the partition wall prevents soil and water in the filling area from entering the non-filling area. The shield docking model is disposed in the filling area and is a reduced-scale test model.

The shield docking model is provided with the freezing system, and the freezing system includes a refrigeration system, a coolant circulation system, and freezing pipes. The freezing pipes are arranged on the shield docking model and are connected to the refrigeration system through the coolant circulation system. The refrigeration system is placed on a laminate in the non-filling area of the test soil tank.

An internal length L of the test soil tank satisfies:

$$L = L_1 + t_w + L_2$$

In the formula, $L_1$ is an internal length of the filling area, $t_w$ is a thickness of the partition wall, and $L_2$ is an internal length of the non-filling area in the test soil tank.

An internal width W and an internal depth H of the model soil tank are identical and satisfy the following formula:

$$W = H = D_m + 2l'_{fmax} + 2B$$

In the formula, $D_m$ is an outer diameter of a shield in the shield docking model, $l'_{fmax}$ is a maximum projection length of the freezing pipes in a radial direction of the shield, and B is a distance from an outermost end of the freezing pipes to an interior of the test soil tank.

Further, the shield docking model consists of a first model tunnel and a second model tunnel arranged longitudinally. The first model tunnel is in communication with the second model tunnel, enabling personnel to enter the shield docking model from the non-filling area. The first model tunnel consists of a first model shield and a first model segment lining, and the second model tunnel consists of a second model shield and a second model segment lining. The first model tunnel is perpendicular to a soil tank sidewall, and the second model tunnel is perpendicular to the partition wall. The first model shield and the second model shield have identical outer diameters. The first model segment lining and the second model segment lining have identical outer diameters and identical inner diameters.

A circular entrance is reserved in the partition wall as a passage for personnel to enter the shield docking model from the non-filling area. Inner dimensions of the circular entrance are identical to inner dimensions of the second model shield. A part of the second model segment lining is placed inside the circular entrance in the partition wall. A second sealing brush and a sealing rubber plate are arranged between the circular entrance and the second model segment lining to prevent soil and water in the filling area from entering the shield docking model or the non-filling area.

Further, a first cylinder group configured for extending and retracting along an axial direction of the first model segment lining is arranged on the soil tank sidewall perpendicular to the first model segment lining. The first cylinder group is circumferentially arranged, with one end being fixed on the soil tank sidewall and the other end acting on an end surface of the first model segment lining to provide ring joint preload stress for the first model segment lining.

A second cylinder group configured for extending and retracting along an axial direction of the second model segment lining is arranged in the circular entrance in the partition wall. The second cylinder group is circumferentially arranged, with one end being fixed in the partition wall and the other end acting on an end surface of the second model segment lining to provide ring joint preload stress for the second model segment lining. The second cylinder group is configured for providing the ring joint preload stress for the second model segment lining.

Further, the internal length L of the test soil tank satisfies:

$$L = L_{s1} + L_{t1} - L'_{t1} + L_{c1} + L_{s2} + L_{t2} - L'_{t2} - L''_{t2} + \Delta + t_w + L_2$$

In the formula, $L_{s1}$ is a length of the first model shield, $L_{t1}$ is a length of the first model segment lining, $L'_{t1}$ is a length of the first model segment lining inside the first model shield, and $L_{c1}$ is a length of the first cylinder group; $L_{s2}$ is a length of the second model shield, $L_{t2}$ is a length of the second model segment lining, $L'_{t2}$ is a length of the second model segment lining inside the second model shield, $L''_{t2}$ is a length of the second model segment lining inside the partition wall, and $\Delta$ is a docking gap between the two model tunnels.

Further, a half sleeve is preset on the soil tank sidewall and the half sleeve is cylindrical with one end being fixed on the soil tank sidewall. Inner dimensions of the half sleeve are identical to inner dimensions of the first model shield. A first sealing brush and a sealing rubber plate are arranged between the half sleeve and the first model segment lining to prevent soil and water in the filling area from entering the shield docking model.

Further, the first model tunnel and the second model tunnel are provided with ring beams at docking ends to simulate actual front shield parts. Inner profile dimensions of the ring beams are identical to both inner dimensions of the first model segment lining and inner dimensions of the second model segment lining. A temporary retaining and protection structure is installed between the docking end ring beams of the first model shield and the second model shield to prevent soil and water in the filling area from entering the first model tunnel or the second model tunnel, and the temporary retaining and protection structure does not increase connection rigidity of the docking ends between the first model shield and the second model shield.

Preferably, the test platform further includes sensors. The sensors include surface strain gauges, thermometers, embedded strain gauges, soil pressure gauges, array displacement meters, and joint meters.

The surface strain gauges are provided on inner and outer surfaces of the first model shield and the second model shield, and are arranged in circumferential and longitudinal directions to monitor stress in the shields. The thermometers are arranged in strata to monitor the development of frozen bodies. The embedded strain gauges are buried in the first model segment lining and the second model segment lining and are arranged in the circumferential and longitudinal directions. The soil pressure gauges arranged on the outer surfaces of the first model shield and the second model shield monitor frost heave load during freezing, and the soil pressure gauges arranged on the soil tank sidewall monitor the impact of the frost heave load on test boundaries. The array displacement meters are arranged on the inner surfaces of the first model shield, the second model shield, the first model segment lining, and the second model segment lining, the circumferentially arranged array displacement meters measure cross-sectional deformation of the shield docking model, and the longitudinally arranged array displacement meters measure longitudinal deformation of the shield docking model. The joint meters are arranged at ring joints of the first model segment lining and the second model segment lining, to monitor changes in ring joint opening amounts of the first model segment lining and the second model segment lining.

Further, the half sleeve is long enough to cover the first cylinder group and a half width of a model segment lining ring and is long enough to set waterproof sealing measures.

A length lns of the half sleeve satisfies the following formula:

$$l_{hs} \geq l_{c1} + 0.5 w_s + \Delta l_{ws}$$

In the formula, $l_{c1}$ is a maximum length of the first cylinder group, $w_s$ is a width of a single model lining ring, and $\Delta l_{ws}$ is a length for setting waterproof sealing measures.

Further, the ring joint preload stress provided by the first cylinder group for the first model segment lining satisfies the following formula:

$$p \geq \frac{F}{S \cdot c_\sigma}$$

In the formula, p is the ring joint preload stress for the first model segment lining, F is a resultant water and soil pressure in front of a prototype shield cutterhead, S is contact area of prototype lining ring joints, and ca is a stress similarity ratio of a model test.

The ring joint preload stress provided by the second cylinder group is identical to the ring joint preload stress provided by the first cylinder group.

Compared with the prior art, the present disclosure has the following advantages.

To solve the above problems in the prior art and eliminate the deficiencies of the prior art, the present disclosure provides the large-scale underground shield docking model test platform. The test platform allows personnel to enter the shield docking model to debug and operate various test systems, so as to effectively simulate grouting reinforcement, freezing reinforcement, freeze-thawing, and other processes in underground shield docking. Through the test platform and the test method, the grouting and freezing reinforcement tests for underground shield docking can be carried out to accurately explore issues such as the deformation characteristics of the shield and the segment lining along the cross section and the longitudinal direction of the tunnel, the opening and misalignment of the segment joints, the stress and stability characteristics of the shield, the coupling effect of grouting and freezing reinforcement, and the grout spreading situation. A reliable solution is provided for the research of the shield docking technology and feasible suggestions are put forward for the optimization, comparison, and selection of strata reinforcement schemes.

1. According to the present disclosure, personnel can enter the shield docking model to carry out debugging of the freezing system, installation of the grouting or freezing system pipelines, and parameter adjustment during the test, thereby realizing tests in more working conditions. The test soil tank is separated by the partition wall into a filling area and a non-filling area. The shield docking model is buried in the filling area. One end of the shield docking model passes through the entrance reserved in the partition wall, so that the internal space of the shield docking model is in communication with the non-filling area. Therefore, the test personnel can enter the shield docking model from the non-filling area through the entrance reserved in the partition wall. In addition, waterproof components such as the sealing brush and the sealing rubber plate are arranged at the connection part between the shield docking model and the entrance, which is ingenious and practical.

2. In the present disclosure, the width and depth of the test soil tank are designed to meet the requirements of the cross-sectional boundary conditions in the shield docking model test, which enables more accurate study of the stress and deformation characteristics along the cross section of the shield and further enables accurate evaluation about whether the safety and the deformation of the shield structure exceed limit during the shield docking process.

3. The present disclosure takes into account the arrangement of at least seven model lining rings behind the shield tail in the shield docking model, and simulates the longitudinal preload stress between the model segment lining rings. Therefore, the deformation characteristics along the longitudinal direction of the model tunnel and the opening and misalignment characteristics of the joints during the shield docking process can be more accurately determined, and the waterproof safety of the joints is evaluated to provide a reference for the design of segment lining structure reinforcement schemes.

4. The present disclosure can effectively study the grouting reinforcement and grout spreading mechanisms, the grouting reinforcement effect, and the coupling effect of grouting and freezing reinforcement, to provide a reference for the design of similar engineering reinforcement schemes.

Figure 1:
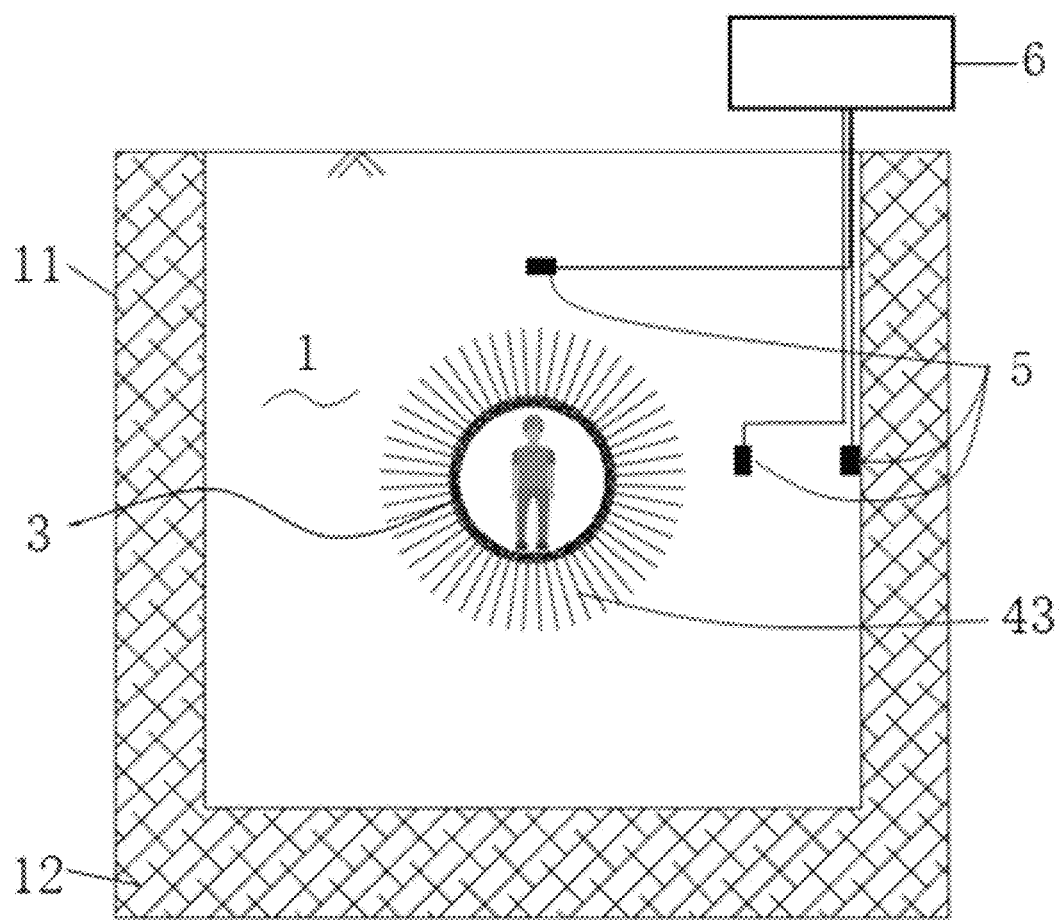
FIG. 1 is a front view of a test platform.

In the drawings: 1. test soil tank, 2. partition wall, 3. shield docking model, 4. freezing system, 5. sensor, 6. data acquisition system, 11. soil tank sidewall, 12. soil tank bottom plate, 13. filling area, 14. non-filling area, 15. laminate, 16. pedestrian staircase, 31. first model shield, 32. first model segment lining, 33. second model shield, 34. second model segment lining, 35. first cylinder group, 36. half sleeve, 37. first sealing brush, 38. second cylinder group, 39. second sealing brush, 41. refrigeration system, 42. coolant circulation system, 43. freezing pipe.

DETAILED DESCRIPTION OF THE EMBODIMENTS

A large-scale underground shield docking model test platform of the present disclosure is further described in detail below with reference to the accompanying drawings and specific embodiments.

Figure 2:
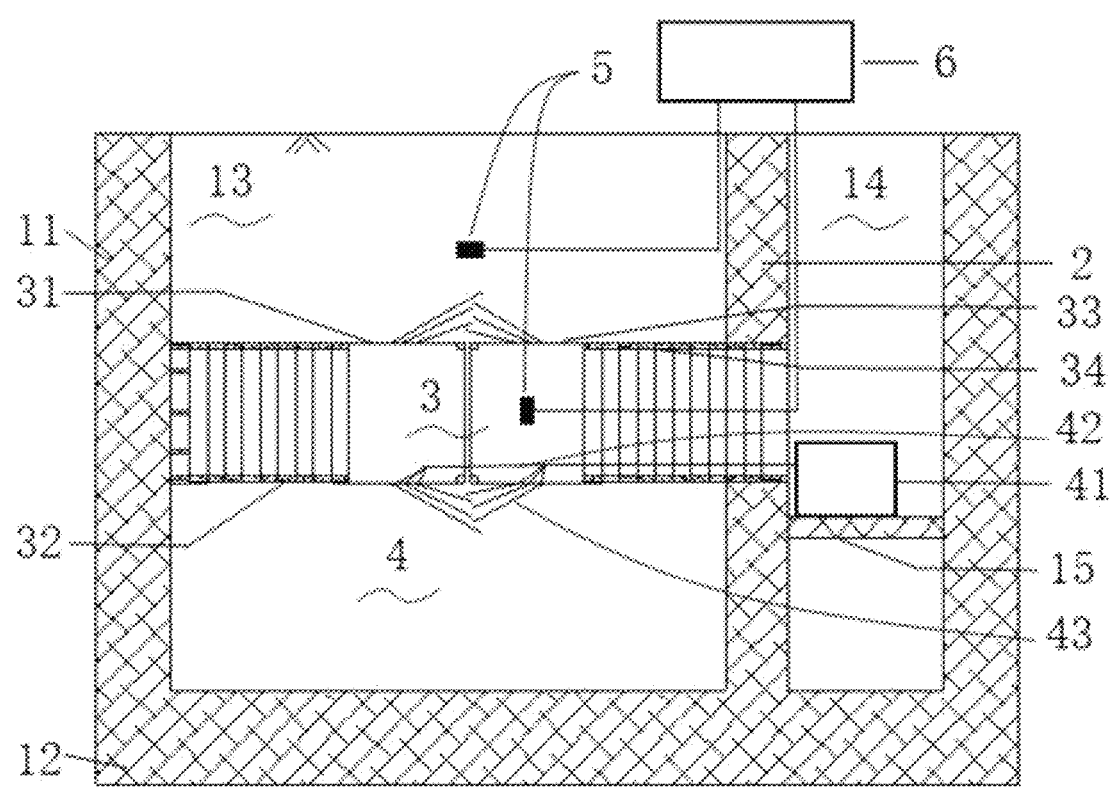
FIG. 2 is a sectional side view of the test platform.
Figure 3:
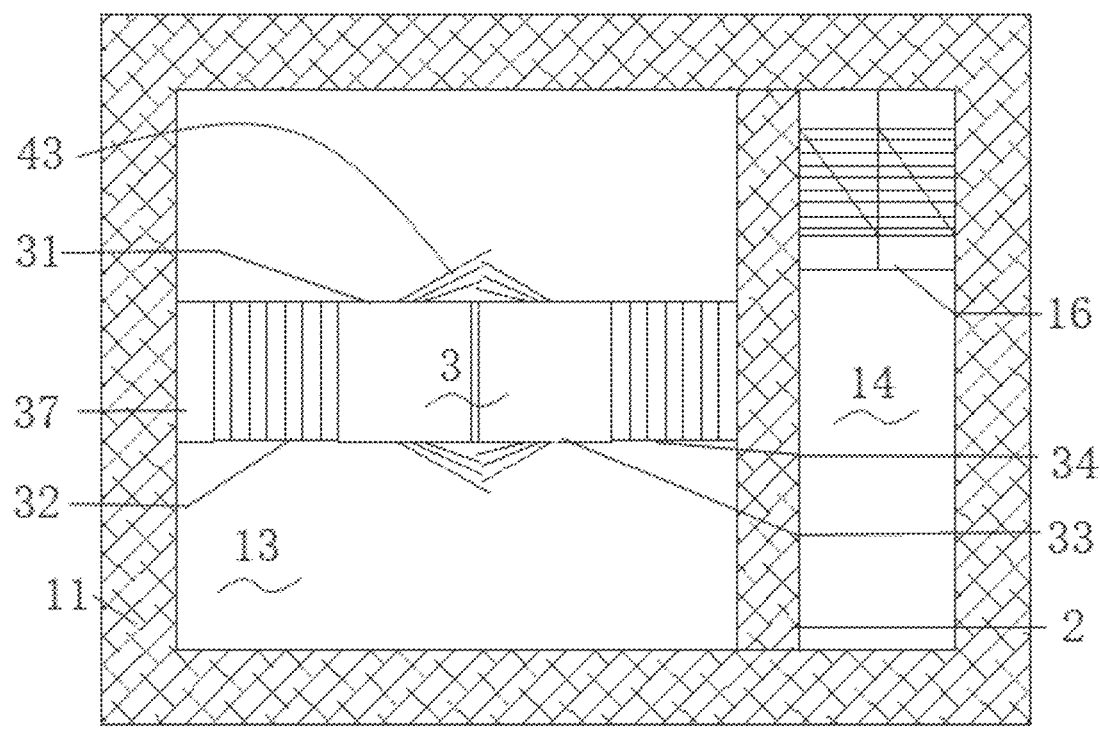
FIG. 3 is a top view of the test platform.
Figure 4:
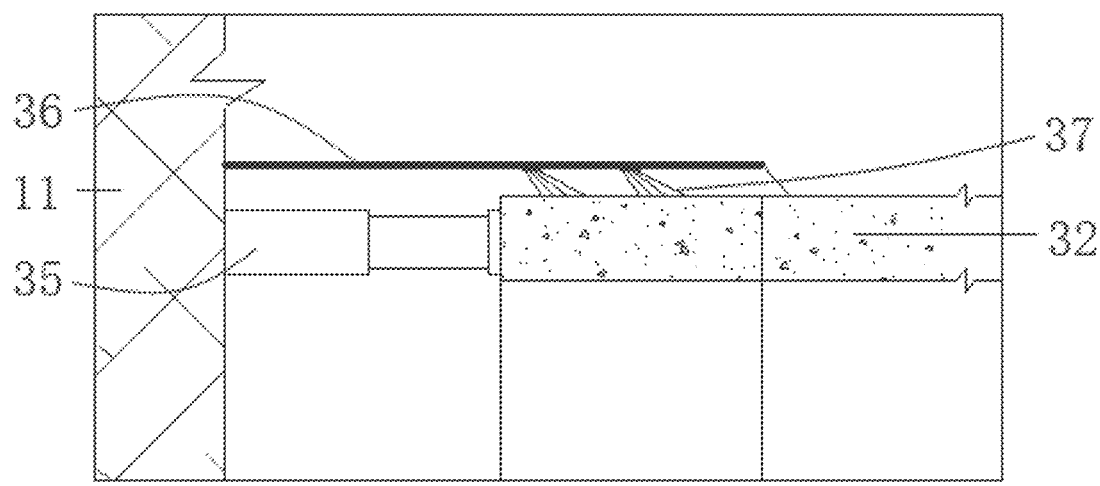
FIG. 4 is a schematic structural diagram of a connection part between a first model segment lining and a test soil tank sidewall.
Figure 5:
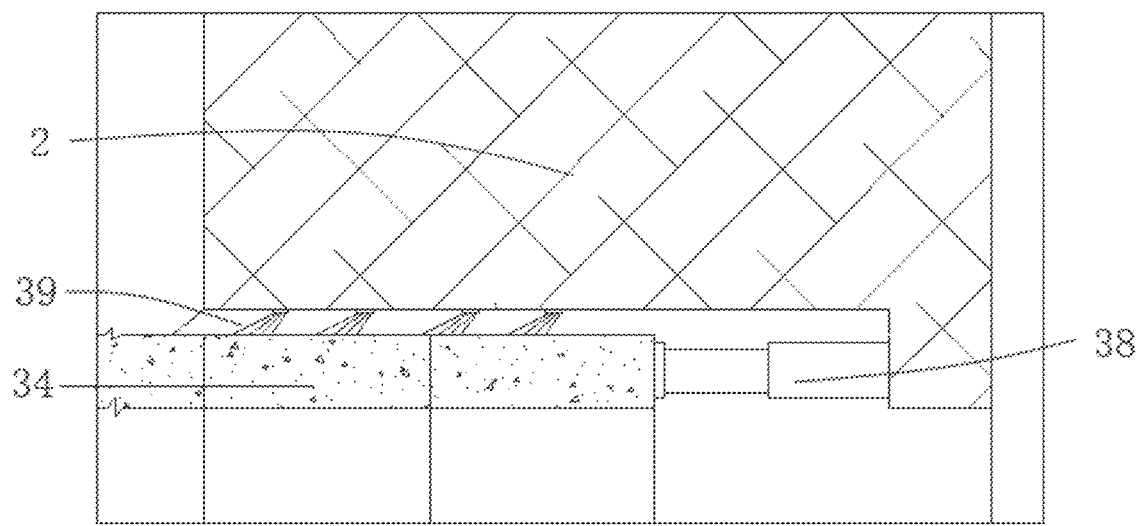
FIG. 5 is a schematic structural diagram of a connection part between a second model segment lining and a partition wall.

The present disclosure provides a large-scale underground shield docking model test platform. As shown in FIG. 1 to FIG. 5, the test platform includes a test soil tank 1, a partition wall 2, a shield docking model 3, a freezing system 4, sensors 5, and a data acquisition system 6.

The test soil tank 1 is of an underground foundation pit structure, the top of which is flush with the ground surface. A soil tank sidewall 11 and a soil tank bottom plate 12 of the test soil tank 1 are of reinforced concrete structures. In this embodiment, the soil tank sidewall 11 is 1200 mm thick and the soil tank bottom plate 12 is 1500 mm thick.

The partition wall 2 is disposed in the test soil tank 1. The partition wall 2 is of a reinforced concrete structure and separates the test soil tank 1 into a filling area 13 and a non-filling area 14. The partition wall 2 is in rigid connection to the soil tank sidewall 11 and the soil tank bottom plate 12. The partition wall 2 prevents soil and water in the filling area 13 from entering the non-filling area 14.

The shield docking model 3 is a reduced-scale test model consisting of a first model tunnel and a second model tunnel arranged longitudinally, and is disposed in the filling area 13 of the test soil tank 1. The first model tunnel consists of a first model shield 31 and a first model segment lining 32. The second model tunnel consists of a second model shield 33 and a second model segment lining 34. The first model tunnel is perpendicular to the soil tank sidewall 11, and the second model tunnel is perpendicular to the partition wall 2. The reduced scale of this test is 1:7, that is, the similarity ratios of the model shield outer diameter, the model shield inner diameter, the model shield length, the gap at the docking section between the two model shields, the model segment lining outer diameter, and the width of the model segment lining ring to the prototype are all 1:7. In this embodiment, the prototype shield has an outer diameter of 15.97 m, while the first model shield 31 and the second model shield 33 have the same outer diameters of 2.28 m. The prototype segment lining has an outer diameter of 15.5 m, while the first model segment lining 32 and the second model segment lining 34 have the same outer diameters of 2.21 m and the same inner diameters of 2.02 m. This test platform allows personnel to stand in the model tunnel to perform test operations.

A first cylinder group 35 configured for extending and retracting along the axial direction of the first model segment lining 32 is arranged on the test soil tank sidewall 11 perpendicular to the first model segment lining 32. The first cylinder group 35 is circumferentially arranged, with one end being fixed on the soil tank sidewall 11 and the other end acting on an end surface of the first model segment lining 32 to provide ring joint preload stress for the first model segment lining 32. The first cylinder group 35 is configured for providing the ring joint preload stress for the first model segment lining 32. The preload stress p satisfies the following formula:

$$p \geq \frac{F}{S \cdot c_\sigma}$$

In the formula, p is the ring joint preload stress for the model segment lining, F is the resultant water and soil pressure in front of the prototype shield cutterhead, S is the contact area of the prototype lining ring joints, and $c_\sigma$ is the stress similarity ratio of the model test. The ring joint preload stress for the first model segment lining is not less than 3 MPa in this embodiment.

A half sleeve 36 is preset on the soil tank sidewall 11 perpendicular to the first model segment lining 32. The half sleeve 36 is cylindrical with one end being fixed on the soil tank sidewall 11. The inner dimensions of the half sleeve 36 are identical to the inner dimensions of the first model shield 31. A first sealing brush 37 and a sealing rubber plate are arranged between the half sleeve 36 and the first model segment lining 32 to prevent soil and water in the filling area 13 from entering the shield docking model 3. The half sleeve 36 is long enough to cover the first cylinder group 35 and a half width of a model segment lining ring and is long enough to set waterproof sealing measures. The length lns of the half sleeve satisfies the following formula:

$$l_{hs} \geq l_{c1} + 0.5 w_s + \Delta l_{ws}$$

In the formula, let is the maximum length of the first cylinder group 35, $w_s$ is the width of a single model lining ring, and $\Delta l_{ws}$ is the length for setting waterproof sealing measures.

In this embodiment, the extension length of the first cylinder group 35 is 300 mm, the single-ring width of the first model segment lining 32 is 286 mm, the length of the half sleeve 36 is 586 mm, and the inner diameter of the half sleeve 36 is 2.24 m.

A circular entrance is reserved in the partition wall 2 as a passage for personnel to enter the shield docking model 3 from the non-filling area 14. The inner dimensions of the circular entrance are identical to the inner dimensions of the second model shield 33. A part of the second model segment lining 34 is placed inside the circular entrance in the partition wall 2. A second sealing brush 39 and a sealing rubber plate are arranged between the circular entrance and the second model segment lining 34, to prevent soil and water in the filling area 13 from entering the shield docking model 3 or the non-filling area 14.

A second cylinder group 38 configured for extending and retracting along the axial direction of the second model segment lining 34 is arranged in the circular entrance in the partition wall 2. The second cylinder group 38 is circumferentially arranged, with one end being fixed in the partition wall 2 and the other end acting on an end surface of the second model segment lining 34 to provide ring joint preload stress for the second model segment lining 34. The second cylinder group 38 is configured for providing the ring joint preload stress for the second model segment lining 34. The preload stress calculation formula is the same as that of the first model segment lining 32.

The first model tunnel is in communication with the second model tunnel, enabling personnel to enter the shield docking model 3 from the non-filling area 14 and carry out equipment installation, data acquisition, freezing control, and other operations.

The first model tunnel and the second model tunnel are provided with ring beams at the docking ends to simulate actual front shield parts of high rigidity. The inner profile dimensions of the ring beams are identical to the inner dimensions of the model segment linings. A temporary retaining and protection structure is installed between the docking end ring beams of the first model shield 31 and the second model shield 33. The temporary retaining and protection structure prevents soil in the filling area 13 from entering the first model tunnel or the second model tunnel, and does not increase the rigidity of the docking ends between the first model shield 31 and the second model shield 33.

Six temporary support structures are arranged inside each of the first model tunnel and the second model tunnel and mainly serve as backup safety measures. During the test stage, the temporary support structures do not provide support and will not affect the rigidity of the model tunnel. They mainly function when the model tunnel becomes unstable and is damaged, to avoid excessive deformation of the tunnel that threatens the safety of the test personnel and equipment.

One of the core functions of this test platform is to conduct freezing tests. The freezing tests are mainly performed by the freezing system 4 which includes a refrigeration system 41, a coolant circulation system 42, and freezing pipes 43. The freezing system 4 can realize freezing of the freezing pipes 43 in different rows at different temperatures and at different time points. The freezing pipes 43 arranged on the first model shield 31 and the second model shield 33 are connected to the refrigeration system 41 through the coolant circulation system 42. The refrigeration system 41 is placed on a laminate 15 in the non-filling area 14.

Holes allowing the freezing pipes 43 to pass through are reserved in steel shells of the first model shield 31 and the second model shield 33. The number, position, and angle of the reserved holes should correspond to the actual project. After the shield docking model 3 is buried in soil, all the freezing pipes 43 are inserted into soil through the holes reserved in the first model shield 31 and the second model shield 33. The gaps between the freezing pipes 43 and the reserved holes in the first model shield 31 and the second model shield 33 are sealed by welding.

The test platform has the function of conducting grouting tests. The freezing pipes 43 can be used in the grouting tests. The pipeline is replaced according to the test progress. Sleeve valve pipe grouting, drill rod retreat grouting, or hole grouting can be employed.

The sensors 5 include surface strain gauges, thermometers, embedded strain gauges, soil pressure gauges, array displacement meters, and joint meters. The surface strain gauges are provided on inner and outer surfaces of the first model shield 31 and the second model shield 33, and are arranged in the circumferential and longitudinal directions to monitor the stress in the shields. The thermometers are arranged in strata to monitor the development of frozen bodies. The embedded strain gauges are buried in the first model segment lining 32 and the second model segment lining 34 and are arranged in the circumferential and longitudinal directions. Some of the soil pressure gauges are fixed on the outer surfaces of the first model shield 31 and the second model shield 33 to monitor the frost heave load during freezing, and some of the soil pressure gauges are fixed on the soil tank sidewall 11 to monitor the impact of the frost heave load on test boundaries. The array displacement meters are arranged on the inner surfaces of the first model shield 31, the second model shield 33, the first model segment lining 32, and the second model segment lining 34. The circumferentially arranged array displacement meters measure the cross-sectional deformation of the shield docking model 3, and the longitudinally arranged array displacement meters measure the longitudinal deformation of the shield docking model 3. The joint meters are arranged at the ring joints of the first model segment lining 32 and the second model segment lining, to monitor changes in joint opening amounts of the first model segment lining 32 and the second model segment lining 34.

The data acquisition system 6 is located outside the test soil tank 1 and has the functions of real-time data acquisition, display, and storage.

The data cables of the surface strain gauges and the soil pressure gauges installed outside the shield docking model 3 are guided to the soil tank sidewall 11 in the filling area 13, and extend upward to be connected to the data acquisition system 6 on the ground surface. The data cables of the surface strain gauges, the array displacement meters, and the joint meters installed in the shield docking model 3 and the data cables of the embedded strain gauges buried in the first model segment lining 32 and the second model segment lining 34 are arranged along the inner surface of the shield docking model 3, pass through the entrance in the partition wall 2, and extend upward along the partition wall 2 to be connected to the data acquisition system 6 on the ground surface.

The calculation formula of the internal length L of the test soil tank 1 is:

$$L = L_1 + t_w + L_2 = L_{s1} + L_{t1} - L'_{t1} + L_{c1} + L_{s2} + L_{t2} - L'_{t2} - L''_{t2} + \Delta + t_w + L_2$$

This formula can be used to calculate the required length of the model soil tank, providing a reference for the construction of the model soil tank.

In the formula, $L_1$ is the internal length of the filling area 13; $t_w$ is the thickness of the partition wall 2 and is 1.0 m; $L_2$ is the internal length of the non-filling area 14 in the test soil tank; $L_{s1}$ is the length of the first model shield 31 and is 2.14 m calculated based on the similarity ratio of 1:7; Lu is the length of the first model segment lining 32 and is the width of nine model lining rings, where the width of a single model lining ring is 0.286 m calculated based on the similarity ratio of 1:7 and accordingly $L_{t1}$ is 2.574 m; $L'_{t1}$ is the length of the first model segment lining 32 inside the first model shield 31 and is 0.286 m as the width of a single model lining ring; $L_{c1}$ is the length of the first cylinder group 35 and is 0.3 m; $L_{s2}$ is the length of the second model shield 33 and is 2.14 m also calculated based on the similarity ratio of 1:7; $L_{t2}$ is the length of the second model segment lining 34 and is 2.86 m as the width of ten model lining rings; $L'_{t2}$ is the length of the second model segment lining 34 inside the second model shield 33 and is 0.286 m as the width of a single model lining ring; $L''_{t2}$ is the length of the second model segment lining 34 inside the partition wall 2 and is 0.572 m as the width of two model lining rings; $\Delta$ is a docking gap between the two model tunnels and is 0.116 m; $L_2$ is the internal length of the non-filling area 14 and is 2.5 m to meet the requirements for equipment hoisting, personnel passing, and test operations; and therefore the internal length of the model soil tank is about 12.5 m.

The internal width W and depth H of the model soil tank 1 are determined by the following formula:

$$W = H = D_m + 2l'_{fmax} + 2B$$

This formula can be used to calculate the required width and depth of the model soil tank, providing a reference for the construction of the model soil tank.

In the formula, $D_m$ is the outer diameter of the model shield and is 2.28 m calculated based on the similarity ratio of 1:7; $l'_{fmax}$ is the maximum projection length of the freezing pipes 43 in the radial direction of the model shield and is 0.937 m calculated based on the similarity ratio; B is the distance from the outermost end of the freezing pipes 43 to the interior of the test soil tank 1, and is determined to be 2.42 m by taking the boundary effect of the test and the cost and difficulty of the test into consideration, where B is greater than twice the external expansion size of the freezing pipes 43, that is, greater than twice the thickness of the model frozen wall. It is finally determined that the internal width and height of the test soil tank 1 are both 9 m.

Two sets of ladders can be provided on the soil tank sidewall 11 in the filling area 13, enabling personnel to enter the filling area 13, install the shield docking model 3, and bury the sensors 5. Water supply and drainage systems need to be provided in the filling area 13. The laminate 15 is arranged in the non-filling area 14 of the test soil tank 1. The top surface of the laminate 15 is lower than the reserved entrance in the partition wall 2, and it is convenient for personnel to enter the shield docking model 3 through the entrance. The laminate 2 is sufficient to carry the test equipment such as the refrigeration system and the test personnel. A pedestrian staircase 16 is provided in the non-filling area 14, enabling personnel to reach the laminate 15 by stairs and then enter the shield docking model 3 through the entrance to carry out test operations. Ventilation systems need to be provided inside the non-filling area 14 and the shield docking model 3. The test platform needs to be equipped with safety facilities and emergency facilities. For example, a fence is set up around the test soil tank 1, and the test platform is provided with safety ropes, life buoys, liquid nitrogen freezing equipment, cement mortar and injection equipment, polyurethane and injection equipment, and so on.

The present disclosure also provides a large-scale underground shield docking model test method, which performs the following steps based on the above test platform.

S1: The test platform is set up, which includes creating the test soil tank 1, building the partition wall 2 and reserving the entrance, and installing the water supply and drainage systems, the ventilation system, the data acquisition system 6, the safety and emergency facilities, the ladders in the filling area 13, and the pedestrian staircase 16 and the laminate 15 in the non-filling area 14.

S2: The shield docking model 3 including the first model shield 31, the second model shield 33, the first model segment lining 32, the second model segment lining 34, the first cylinder group 35, the half sleeve 36, the first sealing brush 37, the second cylinder group 38, and the second sealing brush 39 is built.

S3: The grouting system, the freezing system 4, the components and data cables of the sensors 5, and the test soil required are prepared.

S4: The first cylinder group 35, the half sleeve 36, the first sealing brush 37, the second cylinder group 38, and the second sealing brush 39 are installed.

S5: Soil is filled and compacted in layers at the bottom of the shield tunnel, and the sensors 5 are buried at designed positions. The overall height of the soil filled slightly exceeds the bottom of the shield docking model 3.

S6: The shield docking model 3 including the first model shield 31, the second model shield 33, the first model segment lining 32, the second model segment lining 34, the temporary support structures inside the model tunnel, and the temporary retaining and protection structure at the docking section is installed.

S7: Waterproof treatment is performed on the model tunnel at positions including: the model docking section, the connection part between the first model shield 31 and the first model segment lining 32, the connection part between the second model shield 33 and the second model segment lining 34, the connection part between the first model segment lining 32 and the half sleeve 36 on the sidewall, and the connection part between the second model segment lining 34 and the entrance in the partition wall 2.

S8: The sensors 5 inside and outside the shield docking model 3 are installed and are guided into the data acquisition system 6.

S9: Soil is filled and compacted in layers to the designed height, and the sensors 5 are buried at the designed positions.

S10: Water is injected into the soil in the filling area, and whether there is water leakage in parts such as the half sleeve 36, the shield docking model 3, and the entrance in the partition wall 2 is checked during the water injection process.

S11: According to the test plan, tests such as grouting reinforcement, freezing reinforcement, freeze-thawing, and thaw settlement grouting are carried out, the responses of the shield docking model 3 and the soil during the test are monitored, the test process is recorded, and the test data are stored.

S12: After the test, the water in the filling area is drained, the test soil is excavated layer by layer, the grout spreading situation is checked and recorded, and soil samples are collected to carry out mechanical parameter tests on the reinforced soil.

S13: Test data and image information are stored.

S14: The test equipment and tools are put away, and the test platform is cleaned for the next use.

Further, in S7, the data cables of the surface strain gauges and the soil pressure gauges installed outside the shield docking model 3 are guided to the soil tank sidewall 11 in the filling area, and extend upward to be connected to the data acquisition system 6 on the ground surface. The data cables of the surface strain gauges, the array displacement meters, and the joint meters installed inside the shield docking model 3 and the data cables of the embedded strain gauges buried in the model segment linings are arranged along the inner surfaces of the model tunnels, pass through the entrance in the partition wall 2, and extend upward along the partition wall 2 to be connected to the data acquisition system 6 on the ground surface.

Further, different grouting processes, grouting materials, grouting sequences, grouting pressures, and grouting volumes can be designed in the grouting reinforcement scheme in S10. Different coolant temperatures can be set in different freezing pipelines and different freezing pressure relief schemes, freezing pipe lengths, and so on can be designed in the freezing reinforcement scheme in S10. Different thaw settlement grouting schemes including the thaw settlement grouting process, grouting volume, grouting timing, and so on can be designed in freeze-thawing and thaw settlement grouting in S10. After the grouting test phase is completed, personnel enter the shield docking model, remove the grouting test system, and install the freezing test system.

Further, the mechanical parameter tests that can be carried out on the grouting reinforced soil in S11 include: direct shear tests; permeability tests; thermodynamic tests of specific heat capacity and heat conductivity coefficient; and laboratory frozen soil tests on samples, including uniaxial compressive strength tests, shear strength tests, and flexural strength tests.

The content of the present disclosure has been described in detail through the above preferred embodiments, but it should be understood that the above description shall not be considered as a limitation to the present disclosure. It is apparent to persons skilled in the art that various modifications and replacements can be made to the present disclosure based on the above content. Therefore, the protection scope of the present disclosure shall be limited by the appended claims.

What is claimed is:

1. A large-scale underground shield docking model test platform, comprising:

a test soil tank, a partition wall, a shield docking model, and a freezing system, wherein the test soil tank is of an underground foundation pit structure, the partition wall is disposed in the test soil tank to separate the test soil tank into a filling area and a non-filling area, and the partition wall prevents soil and water in the filling area from entering the non-filling area, the shield docking model is disposed in the filling area and is a reduced-scale test model;

the shield docking model is provided with the freezing system, and the freezing system comprises a refrigeration system, a coolant circulation system, and freezing pipes, the freezing pipes are arranged on the shield docking model and are connected to the refrigeration system through the coolant circulation system, the refrigeration system is placed on a laminate in the non-filling area of the test soil tank;

an internal length L of the test soil tank satisfies:

$$L = L_1 + t_w + L_2$$

wherein L; is an internal length of the filling area, $t_w$ is a thickness of the partition wall, and $L_2$ is an internal length of the non-filling area in the test soil tank;

an internal width W and an internal depth H of the test soil tank are identical and satisfies:

$$W=H=D_m+2l'_{fmax}+2B$$

wherein $D_m$ is an outer diameter of a shield in the shield docking model, $l'_{fmax}$ is a maximum projection length of the freezing pipes in a radial direction of the shield, and B is a distance from an outermost end of the freezing pipes to an interior of the test soil tank;

the shield docking model comprises a first model tunnel and a second model tunnel arranged longitudinally, and the first model tunnel is in communication with the second model tunnel, enabling a personnel to enter the shield docking model from the non-filling area, the first model tunnel comprises a first model shield and a first model segment lining, the second model tunnel comprises a second model shield and a second model segment lining, the first model tunnel is perpendicular to a soil tank sidewall, and the second model tunnel is perpendicular to the partition wall, the first model shield and the second model shield have identical outer diameters, and the first model segment lining and the second model segment lining have identical outer diameters and identical inner diameters;

a circular entrance is reserved in the partition wall as a passage for the personnel to enter the shield docking model from the non-filling area, inner dimensions of the circular entrance are identical to inner dimensions of the second model shield, a part of the second model segment lining is placed inside the circular entrance in the partition wall, and a second sealing brush and a first sealing rubber plate are arranged between the circular entrance and the second model segment lining to prevent the soil and the water in the filling area from entering the shield docking model or the non-filling area;

a first cylinder group configured for extending and retracting along an axial direction of the first model segment lining is arranged on the soil tank sidewall perpendicular to the first model segment lining, and the first cylinder group is circumferentially arranged, with a first end being fixed on the soil tank sidewall and a second end acting on an end surface of the first model segment lining to provide a first ring joint preload stress for the first model segment lining;

a second cylinder group configured for extending and retracting along an axial direction of the second model segment lining is arranged in the circular entrance in the partition wall, and the second cylinder group is circumferentially arranged, with a first end being fixed in the partition wall and a second end acting on an end surface of the second model segment lining to provide a second ring joint preload stress for the second model segment lining; the second cylinder group is configured for providing the second ring joint preload stress for the second model segment lining;

the internal length L of the test soil tank satisfies:

$$L=L_{s1}+L_{t1}-L'_{t1}+L_{c1}+L_{s2}+L_{t2}-L'_{t2}-L''_{t2}+\Delta+t_w+L_2$$

wherein $L_{s1}$ is a length of the first model shield, $L_{t1}$ is a length of the first model segment lining, $L'_{t1}$ is a length of the first model segment lining inside the first model shield, and $L_{c1}$ is a length of the first cylinder group, $L_{s2}$ is a length of the second model shield, $L_{t2}$ is a length of the second model segment lining, $L'_{t2}$ is a length of the second model segment lining inside the second model shield, $L''_{t2}$ is a length of the second model segment lining inside the partition wall, and $\Delta$ is a docking gap between the first model tunnel and the second model tunnel;

a half sleeve is preset on the soil tank sidewall, the half sleeve is cylindrical with an end being fixed on the soil tank sidewall, and inner dimensions of the half sleeve are identical to inner dimensions of the first model shield, a first sealing brush and a second sealing rubber plate are arranged between the half sleeve and the first model segment lining to prevent the soil and the water in the filling area from entering the shield docking model;

the first ring joint preload stress provided by the first cylinder group for the first model segment lining satisfies:

$$p \ge \frac{F}{S \cdot c_\sigma}$$

wherein p is the first ring joint preload stress for the first model segment lining, F is a resultant water and soil pressure in front of a prototype shield cutterhead, S is a contact area of prototype lining ring joints, and $c_\sigma$ is a stress similarity ratio of a model test;

the second ring joint preload stress provided by the second cylinder group is identical to the first ring joint preload stress provided by the first cylinder group.

2. The large-scale underground shield docking model test platform according to claim 1, wherein:

the first model tunnel and the second model tunnel are provided with ring beams at docking ends to simulate actual front shield parts, inner profile dimensions of the ring beams being identical to both inner dimensions of the first model segment lining and inner dimensions of the second model segment lining, a temporary retaining and protection structure is installed between the ring beams at the docking ends of the first model shield and the second model shield to prevent the soil and the water in the filling area from entering the first model tunnel or the second model tunnel, and the temporary retaining and protection structure does not increase connection rigidity of the docking ends between the first model shield and the second model shield.

3. The large-scale underground shield docking model test platform according to claim 2, further comprising:

sensors, wherein the sensors comprise surface strain gauges, thermometers, embedded strain gauges, soil pressure gauges, array displacement meters, and joint meters;

the surface strain gauges are provided on inner and outer surfaces of the first model shield and the second model shield, and are arranged in circumferential and longitudinal directions to monitor stress in the first model shield and the second model shield, the thermometers are arranged in strata to monitor development of frozen bodies, the embedded strain gauges are buried in the first model segment lining and the second model segment lining and are arranged in the circumferential and longitudinal directions, the soil pressure gauges arranged on the outer surfaces of the first model shield and the second model shield monitor frost heave load during freezing, and the soil pressure gauges arranged on the soil tank sidewall monitor an impact of the frost heave load on test boundaries, the array displacement meters are arranged on inner surfaces of the first model shield, the second model shield, the first model segment lining and the second model segment lining, circumferentially arranged array displacement meters measure cross-sectional deformation of the shield docking model, and longitudinally arranged array displacement meters measure longitudinal deformation of the shield docking model, the joint meters are arranged at ring joints of the first model segment lining and the second model segment lining, to monitor changes in ring joint opening amounts of the first model segment lining and the second model segment lining.

4. The large-scale underground shield docking model test platform according to claim 3, wherein:

the half sleeve has a length to cover the first cylinder group and a half width of a model segment lining ring and has a length to set waterproof sealing measures;

a length $l_{hs}$ of the half sleeve satisfies:

$$l_{hs} \geq l_{c1} + 0.5 w_s + \Delta l_{ws}$$

wherein $l_{c1}$ is a maximum length of the first cylinder group, $w_s$ is a width of a single model lining ring, and $\Delta l_{ws}$ is a length for setting the waterproof sealing measures.

\* \* \* \* \*